United States Patent [19]

Hirai

[11] Patent Number: 5,547,397
[45] Date of Patent: Aug. 20, 1996

[54] PC CARD CONNECTOR AND PC CARD

[75] Inventor: Yuji Hirai, Tokyo, Japan

[73] Assignee: Honda Tsushin Kogyo Kabushiki Kaisha, Tokyo, Japan

[21] Appl. No.: 341,956

[22] Filed: Nov. 16, 1994

[30] Foreign Application Priority Data

Dec. 8, 1993 [JP] Japan .................................. 5-307786

[51] Int. Cl.$^6$ .................................................. H05K 1/14
[52] U.S. Cl. ........................................ 439/607; 439/946
[58] Field of Search ................................. 439/76.1, 607, 439/608, 946; 361/736, 737; 235/492

[56] References Cited

U.S. PATENT DOCUMENTS 5,085,596  2/1992  Bowen et al. ........................... 439/608

*Primary Examiner*—Neil Abrams
*Attorney, Agent, or Firm*—Armstrong, Westerman, Hattori, McLeland & Naughton

[57] ABSTRACT

A PC card has a print circuit board for mounting memories thereon, a connector 3 which is connected to a wiring portion of the print circuit board 5, a frame 8 for supporting the print circuit board and a pair of covers 9, 9 for covering, from upper and lower sides, the print circuit board, the connector and the frame by engaging them by means of grooves 13 formed in the frame. The connector has a plurality of contacts which are divided into plural sets. The pair of covers are mounted in positions to cover the print circuit board, the connector and the frame and to form a plurality of openings for connection with a mating connector. Those projecting pieces 16 and 17 of the pair of covers which are interposed between adjacent openings engage grooves formed in a connector main body between predetermined adjoining sets of contacts.

3 Claims, 3 Drawing Sheets 5,547,397

PC CARD CONNECTOR AND PC CARD

BACKGROUND OF THE INVENTION

1. Field of the Invention

The present invention relates to a PC (personal computer) card connector (or a connector for a PC card) and a PC card which are used, for example, in a small size computer system interface (SCSI).

2. Description of Related Art

A conventional back connector of a PC card to be used in LAN (local area network), FAX MODEM (fax modulator-demodulator), ISDN (integrated services digital network), or the like, has, for example, a 15-pin contact, but a back connector for a PC card which is compatible with, or conforms to, the SCSI has a multiple-core, e.g., a 32-core, contact.

Cases in which a connector having a multiple-core contact is used as the PC card connector, as described above, have been accompanied by the following problem. Namely, as shown in FIG. 4, the width of an opening c to be formed by a pair of upper and lower metal covers $a_1$, $a_2$ of the PC card is large. Therefore, when there is applied a force tending to incline the PC card towards the thickness thereof while trying to fit, e.g., a cable connector as a mating connector into that mating connector connecting portion (i.e., a connecting portion to receive the mating connector) of the contact which lies exposed in the opening c of the metal covers $a_1$, $a_2$, the metal covers $a_1$, $a_2$ are likely to be deformed, as shown by broken lines, or to be subjected to damage, or the like.

The present invention has an object of providing a PC card connector and a PC card which solve the above-described problems of the conventional ones.

SUMMARY OF THE INVENTION

In order to attain the above and other objects, the present invention is a PC card connector characterized in that a plurality of contacts are disposed by dividing them into a plurality of sets, and that a connector main body has, in between adjoining sets of contacts, grooves for engaging a pair of upper and lower covers for the PC card.

In another aspect, the present invention also provides a PC card comprising a print circuit board for mounting thereon memories, or the like, a connector which is connected to a wiring portion of the print circuit board, a frame for supporting the print circuit board, a pair of covers for covering, from upper and lower sides, the print circuit board, the connectors and the frame by engaging the pair of covers by means of grooves formed in the frame. The connector has a plurality of contacts which are divided into plural sets. The pair of covers form a plurality of openings in which mating connector connecting portions comprising the plural sets of contacts, respectively, lie exposed when the pair of covers are mounted in position by covering the print circuit board, the connector and the frame. Those projecting pieces of the pair of covers which are interposed between predetermined sets of the adjoining openings are engaged with grooves formed in a connector main body between predetermined adjoining sets of contacts.

The above-described connector has a construction in which a plurality of contacts are disposed by dividing them into a plurality of sets. The above-described pair of covers have a plurality of openings in which the mating connector connecting portions comprising the plural sets of contacts, respectively, lie exposed when the covers are mounted in position by covering the print circuit board, the connectors and the frame. Those projecting pieces of the pair of covers which are interposed between predetermined sets of the adjoining openings are engaged with grooves formed in the connector main body between predetermined adjoining sets of contacts. Therefore, when a force is applied in the direction of depth of the PC card while trying to connect the mating connector to the mating connector connecting portions of the plural sets of the contacts, the force is distributed into the plural sets of openings. The cover will therefore be less subjected to deforming.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF A PREFERRED EMBODIMENT

A detailed explanation of an embodying example of the present invention will now be made with reference to the accompanying drawings.

Figure 1:
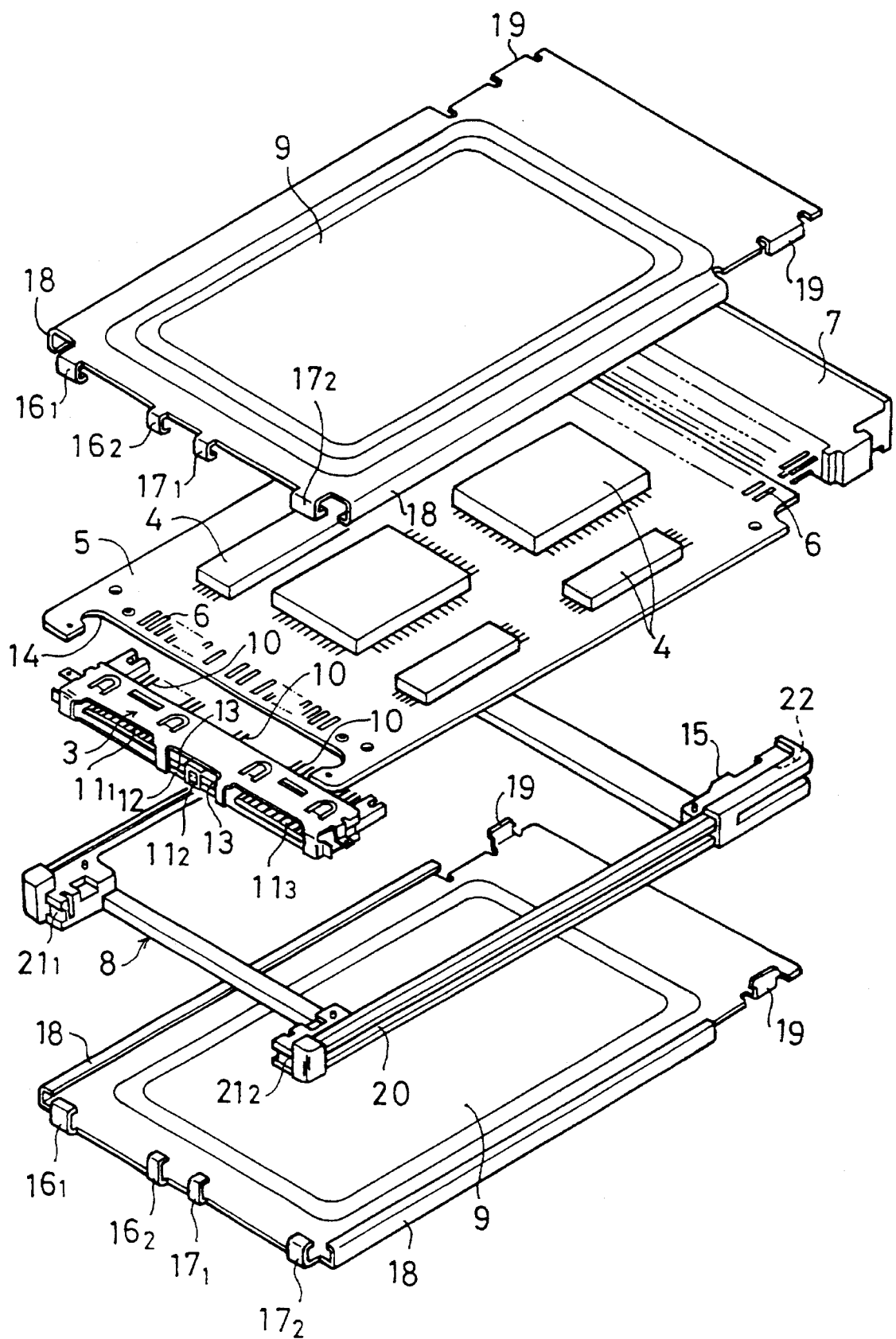
FIG. 1 is a perspective exploded view of a mating connector and a PC card according to one example of the present invention.
Figure 2:
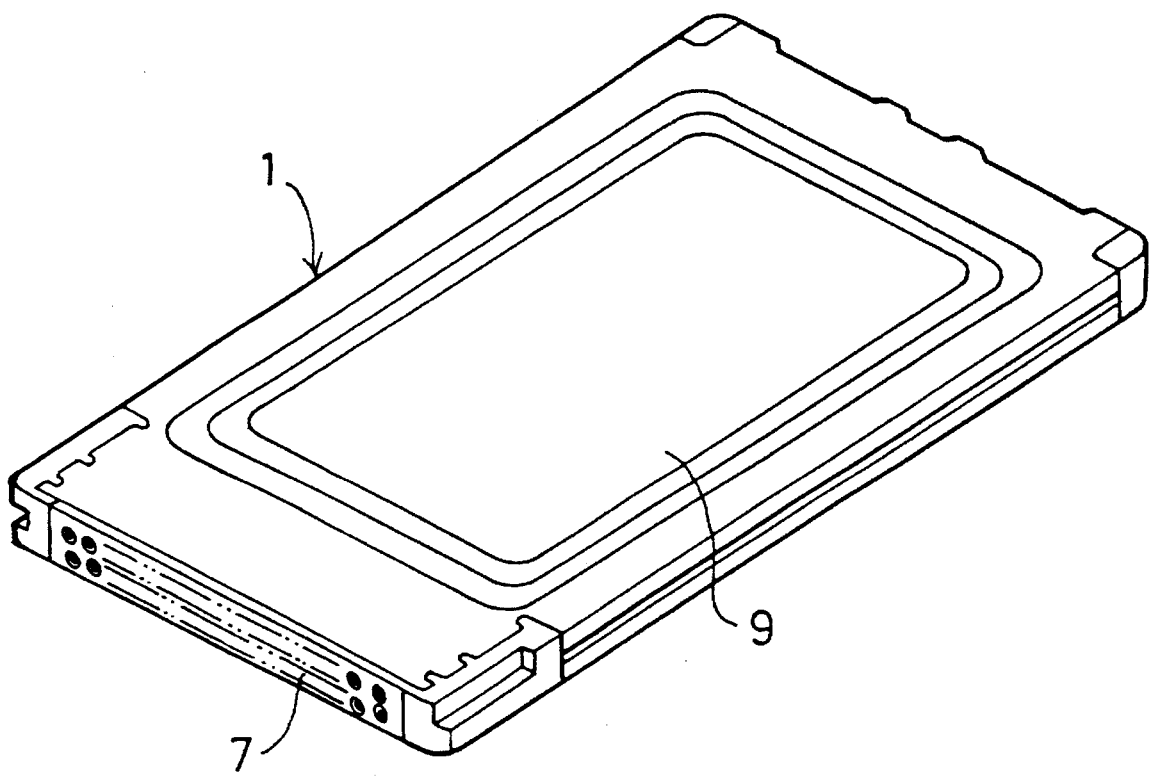
FIG. 2 is a perspective view of the PC card shown in FIG. 1 as seen from the direction "A"
Figure 4:
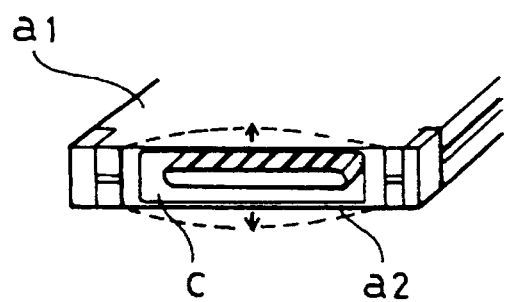
FIG. 4 is a partial perspective view showing the side of the mating connector connecting portion of a conventional PC card.
Figure 3:
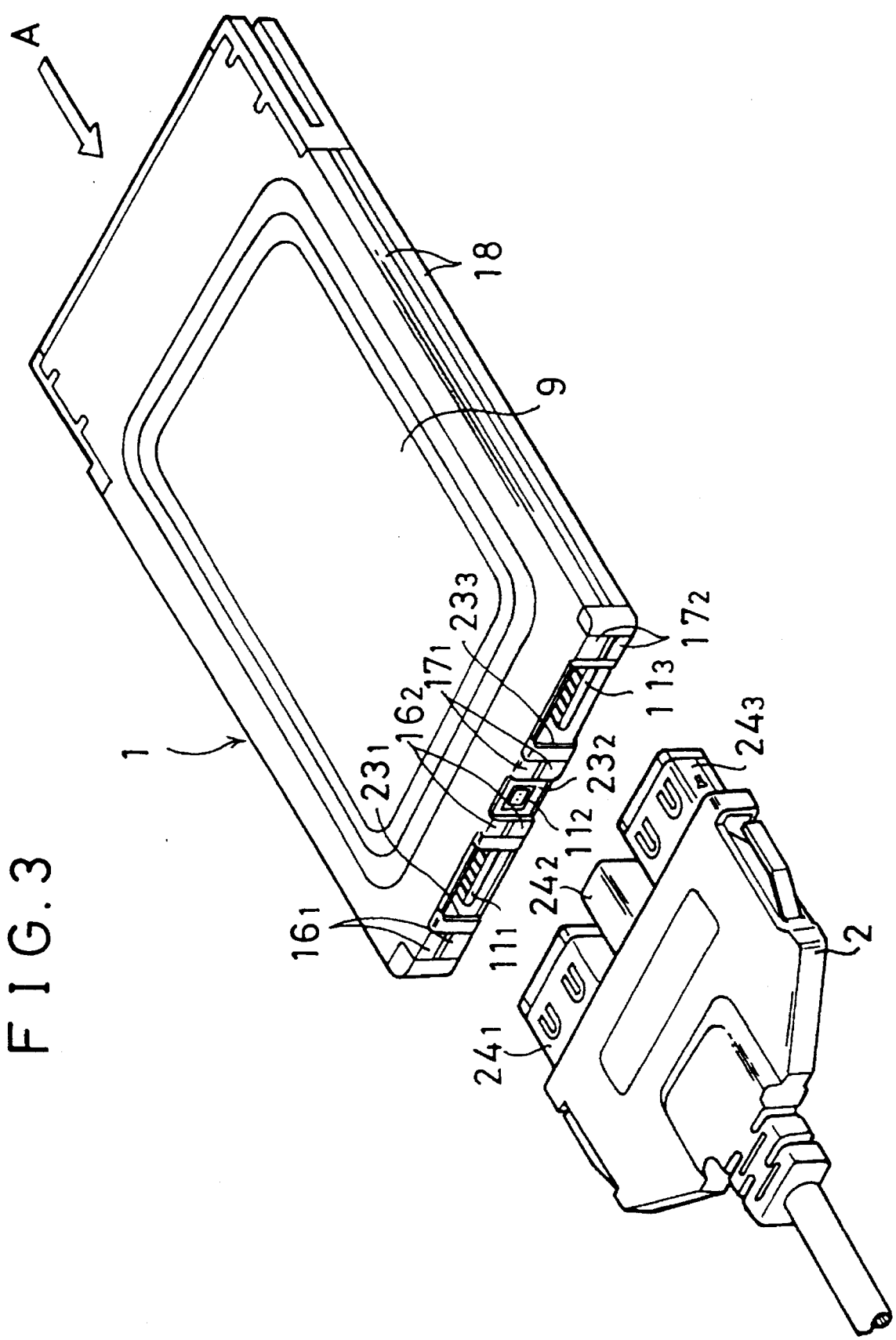
FIG. 3 is a perspective view of the PC card shown in FIG. 1 together with its mating connector.

In FIGS. 1 through 3, numeral 1 denotes a PC card in accordance with the present invention and numeral 2 denotes a mating connector which is to be connected to a back connector 3 of the PC card 1. In case this PC card 1 is used to conform, for example, to the SCSI, the mating connector 2 is connected to a connector in a hard disk drive (HDD) via a cable.

The above-described PC card 1 is made up, as shown in FIG. 1, of the following parts: i.e., a print circuit board 5 for mounting thereon electronic parts 4, such as memories or the like; a back connector 3 and a front connector 7, each to be connected to a wiring portion 6 of the print circuit board 5; a frame 8, for example, of synthetic resin for assembling thereon the print circuit board 5, the back connector 3 and the front connector 7; and a pair of metallic covers 9, 9 made, for example, of a stainless steel for covering the above-described parts from both the upper side and the bottom side.

The back connector 3 is a male connector having, for example, a 32-pin contact 10. The contact 10 is disposed by dividing it into three sets of 15-pin, 2-pin and 15-pin contacts to thereby have three mating connector connecting portions (i.e., connecting portions to receive therein the mating connector) $11_1$, $11_2$ and $11_3$. On a connector main body 12 between the mating connector connecting portions $11_1$ and $11_2$ as well as between $11_2$ and $11_3$, there are respectively formed grooves 13 for receiving therein projecting pieces $16_2$ and $17_1$ as explained hereinbelow. The back connector 3 is fitted into a dented or recessed portion 14 in the circuit board 5. The front connector 7 is fitted into a dented or recessed portion 15 of the frame 8 and is to be connected, for example, to a connector of a computer. The metal covers 9, 9 are provided, in a position corresponding to the front edge of the back connector 3, with bent projecting pieces $16_1$, $16_2$ and $17_1$, $17_2$ of a c-shape in cross section (i.e., channel-like shape). The metal covers 9, 9 are also provided on both sides thereof with elongated bent projecting pieces 18 of a c-shape in cross section as well as tongue (or claw) pieces 19 which are bent at right angles. The above-described bent projecting pieces $16_1$, $16_2$ and $17_1$, $17_2$ are disposed to be respectively separated from each other to have a distance corresponding to the respective width of the mating connector connecting portions $11_1$ and $11_3$ and the bent projecting pieces $16_2$ and $17_1$ are disposed to be separated from each other to have a distance corresponding to the width of the mating connector connecting portion $11_2$.

In the above-described frame 8 there are formed, on its both external lateral sides thereof, grooves 20 into which the front ends of the projecting pieces 18, 18 of the metal covers 9, 9 are fitted. On the external front side of the frame 8, there are formed grooves $21_1$, $21_2$ into which the projecting pieces $16_1$ and $17_2$ of the metal covers 9, 9 are respectively fitted. On the upper side of the frame 8 on the side of the front connector 7, there are formed grooves 22 into which the projecting pieces 19, 19 of the metal covers 9, 9 are fitted.

In assembling the above-described parts together, the print circuit board 5 having attached thereto the back connector 3 is mounted on the frame 8 and the front connector 7 is also attached. Both the metal covers 9, 9 are urged or pressed towards each other from an upper side and a bottom side so that the projecting pieces $16_1$, $16_2$, $17_1$, $17_2$, 18, 18 are respectively fitted into the grooves $21_1$ in the frame 8, grooves 13, 13 in the back connector 3, the groove $21_2$ in the frame 8, and the grooves 20, 20 in the frame 8. The projecting pieces 19, 19 are also fitted into the grooves 22, 22 in the frame 8 to thereby assemble the PC card as shown in FIGS. 1 and 2. In the thus assembled or mounted pair of metal covers 9, 9, there are formed three openings $23_1$, $23_2$ and $23_3$.

In the mating connector 2 to be fitted into the back connector 3, there are separately formed in a projecting manner, as shown in FIG. 1, connecting portions $24_1$, $24_2$ and $24_3$ which are to be connected respectively to the mating connector connecting portions $11_1$, $11_2$ and $11_3$ of the back connector 3. The mating connector connecting portion of the back connector 3 may, of course, be varied in accordance with the number of the multiple-pin contacts.

As has been explained hereinabove, since the present invention has the above-described construction, even if a force may be applied in a direction of the thickness of the PC card when the mating connector is fitted into the multi-core connector of the PC card, there is an advantage in that the cover is neither deformed nor damaged.

It is readily apparent that the above-described PC card connector and the PC card meet all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A PC card comprising:

a print circuit board for mounting electronic circuit elements thereon;

a connector having a connector main body connected to a wiring portion of said print circuit board;

a frame for supporting said print circuit board and containing grooves therein;

a pair of covers covering, from upper and lower sides, said print circuit board, said connector and said frame, each of said covers containing projecting portions attachably received in said grooves;

said connector including a plurality of contacts divided into mutually spaced sets;

said covers cooperating to form a plurality of openings in which said sets of contacts respectively lie exposed for connection with a mating connector; and said connector main body having at least one groove formed therein between adjacent sets of contacts, said pair of covers further comprising projecting portions interposed between predetermined sets of said adjoining openings for engaging with said at least one groove in said connector main body.

2. A PC card connector for connection with a mating connector comprising:

a connector main body containing on one side a plurality of mutually spaced openings disposed on lateral spacings thereacross;

a plurality of contacts for connection with said mating connector, said contacts being divided into a plurality of sets arranged on mutual spacings corresponding to the spacings of said openings whereby each said set is exposed in a respective one of said openings;

upper and lower covers, each containing oppositely extending projecting portions; and groove means formed in said connector and extending peripherally thereabout for engagement of said oppositely extending projecting portions of said covers, said groove means including at least one groove formed in said connector main body traversing at least one of said openings therein and engaging oppositely extending projecting portions of said covers.

3. A PC card connector as claimed in claim 2 in which said at least one groove is disposed in said connector main body traversing an intermediate one of said openings.

\* \* \* \* \*